United States Patent [19]

Urban

[11] Patent Number: 5,549,240

[45] Date of Patent: Aug. 27, 1996

[54] SURFACE MOUNT DEVICE REMOVAL TOOL

[75] Inventor: Paul L. Urban, Cheraw, S.C.

[73] Assignee: Cooper Industries, Inc., Houston, Tex.

[21] Appl. No.: 388,576

[22] Filed: Feb. 14, 1995

[51] Int. Cl.$^6$ .............................. B23K 1/018; B23K 3/02
[52] U.S. Cl. ................. 228/264; 228/19; 29/764
[58] Field of Search .................. 228/264, 55, 19; 29/764

[56] References Cited

U.S. PATENT DOCUMENTS

| | | |
|---|---|---|
| 3,579,795 | 5/1971 | Burman . |
| 3,632,036 | 1/1972 | Halstead . |
| 3,632,973 | 1/1972 | O'Keefe . |
| 3,895,214 | 7/1975 | Winter . |
| 4,034,202 | 7/1977 | Vandermark . |
| 4,136,444 | 1/1979 | Durney . |
| 4,828,162 | 5/1989 | Donner et al. ............... 228/51 |
| 4,855,559 | 8/1989 | Donner . |
| 4,934,582 | 6/1990 | Bertram et al. . |
| 4,962,878 | 10/1990 | Kent . |
| 5,054,681 | 10/1991 | Kim . |
| 5,278,393 | 1/1994 | Kim . |
| 5,297,717 | 3/1994 | Parry . |
| 5,412,178 | 5/1995 | Tamura ............... 228/51 |

FOREIGN PATENT DOCUMENTS 1812018 4/1993 U.S.S.R. ................ 228/264

Primary Examiner—P. Austin Bradley
Assistant Examiner—Jeffrey T. Knapp
Attorney, Agent, or Firm—Burns, Doane Swecker & Mathis LLP

[57] ABSTRACT

A surface mount device desoldering and removal tool includes a flexible carrier plate and a plurality of heated legs attached to the flexible carrier plate for contacting the leads of an electrical component. The flexible carrier plate is sufficiently flexible so that the flexing of the carrier plate allows the plurality of legs to deflect outward to accommodate electrical components of varying sizes. The plurality of legs are heated by electrical resistance heating elements to melt the solder which connects an electrical component to a circuit board. The legs provide a grip on the leads of the electrical component which allows the removal tool to lift the electrical component from the circuit board when all the solder connections have been melted. The flexible carrier plate is advantageously provided with shoulders which allow the electrical component to be easily removed from the removal tool.

21 Claims, 2 Drawing Sheets

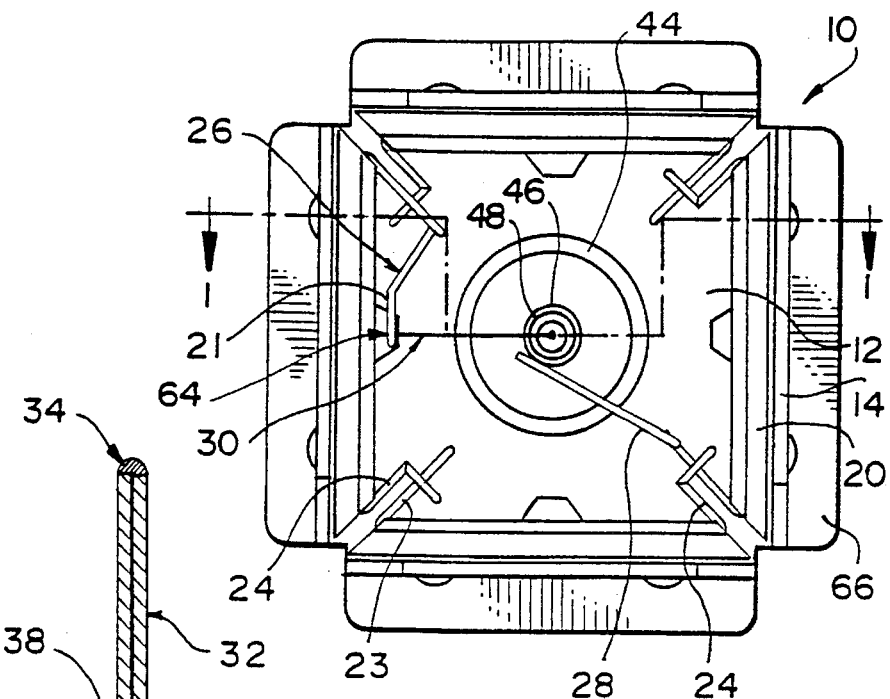
FIG. 2
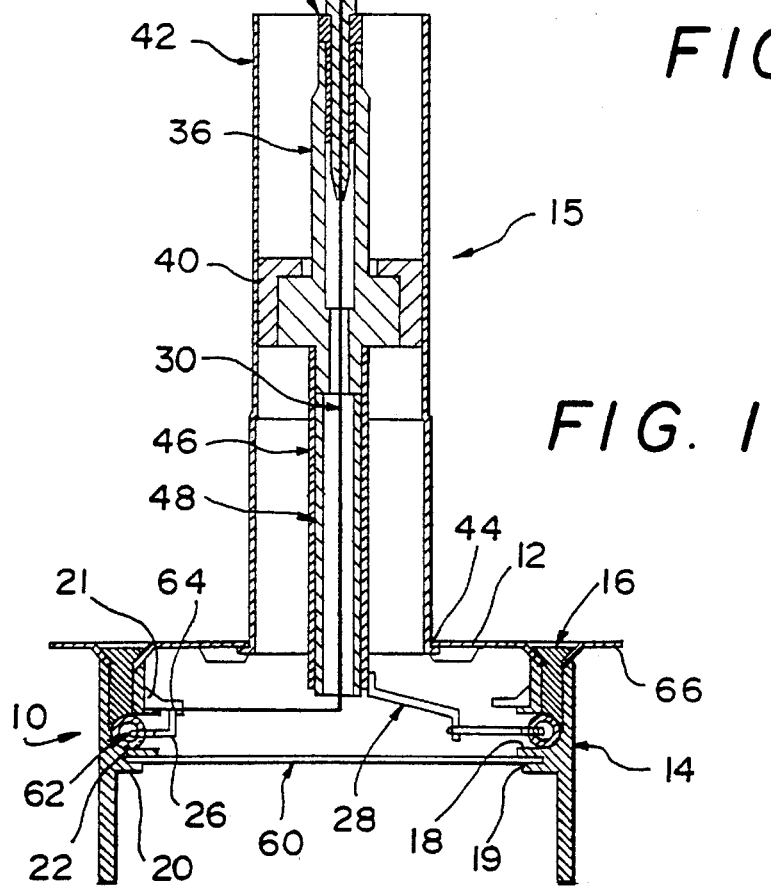
FIG. 1
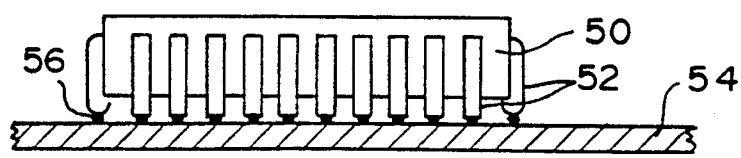

SURFACE MOUNT DEVICE REMOVAL TOOL

BACKGROUND OF THE INVENTION

1. Field of the Invention

The invention relates generally to a device for removal of electrical components and more particularly to a device for desoldering and removing surface mount devices from a circuit board without damaging the circuit board.

2. Description of the Related Art

Surface mount devices include various electronic circuit components having electrical leads protruding from the sides which are attached to printed circuit boards by either solder or conductive adhesive. One type of leads extend straight down from the chip and form a butt joint with the circuit board. Other leads, referred to as gull wing leads extend down from the chip to the board and then extend outward a short distance along the board where they are joined to the board by solder. Still other leads, referred to as J-shaped leads extend down from the chip and curl underneath the chip where they are soldered to the circuit board. Surface mount devices having J-shaped leads are commercially manufactured having dimensional tolerances which are quite large, on the order of 0.01 inches. Therefore, the position of the J-shaped leads relative to one another may vary substantially in chips of the same size and type.

When a surface mount device is found to be faulty or malfunctioning, the component is removed from the circuit board by heating each of the solder connections above its melting temperature. Several methods are available for heating the solder including non-contact heating with a hot gas or infrared lamps, and direct contact heating with special heated tools having tips size to match the individual components. The non-contact methods of heating are typically useful only for repetitive component removal due to the long setup time required to establish the proper operating parameters for these methods.

Contact heating devices are generally useful for removing a few components from a circuit board as the need arises. These contact heating devices generally utilize fixed size contact elements which are configured to contact all of the leads of a particular size chip and are heated via conduction through a conductive stem. The relative large mass of these contact elements prevents rapid heating of the device to operating temperature. Examples of such contact heating devices having fixed size contact elements are disclosed in U.S. Pat. Nos. 3,632,036 and 3,579,795.

Due to the above-described large tolerances in surface mount components having J-shaped leads, the fixed size contact elements must be made to accommodate the largest possible component size within the tolerance allowance. This tolerance allowance causes the contact element to be too large for most components. When the tool tip is too large for a particular component, the contact surfaces do not make contact with all of the leads, whereby some of the soldered connections are not melted. Many circuit boards have been destroyed when trying to remove a component from the board when all the soldered connections have not been melted.

In an attempt to solve this problem, component removal has been conducted with either fixed size removal devices which utilize molten solder or removal devices having a set of movable contact blocks which are moved to contact the leads of the component. In the molten solder type device, grooves are provided in the contact portion of the removal device for molten solder which is used to fill the gaps between the leads of the component and the oversized removal device. The drawback of this device is that the molten solder does not flow into all the grooves in a consistent fashion. When the solder does not reach all the grooves, some of the leads are not contacted, preventing the solder connection from being melted and causing damage to the circuit board.

The grasping type removal devices are provided with grasping contact surfaces which are manually moved to accommodate differences in component size. Examples of grasping type removal devices are shown in U.S. Pat. Nos. 4,034,202 and 3,895,214. These grasping type devices require operator experience and technique to properly align the grasping contact edges with the component leads without damaging the circuit board or surrounding components. Damage to the board can also occur if an attempt is made to remove the component before all the connections are melted.

SUMMARY OF THE INVENTION

The surface mount device removal tool according to the present invention addresses these problems by providing a removal tool which accommodates electrical components of varying sizes and provides contact with each lead to melt all the solder connections and prevent damage to the circuit board. In addition, the removal tool of the present invention allows a user to desolder, remove and discard an electrical component while using only one hand.

A preferred embodiment of the present invention includes a flexible carrier plate and a plurality of heated legs attached to the flexible carrier plate for contacting the leads of an electrical component. The flexible carrier plate is sufficiently flexible so that the flexing of the carrier plate allows the plurality of legs to deflect to accommodate electrical components of varying sizes.

BRIEF DESCRIPTION OF THE DRAWING FIGURES

The invention will be described in greater detail with reference to the accompanying drawings in which like elements bear like reference numerals, and wherein:

FIG. 1 is a side view, in section, of the removal tool according to the present invention;

FIG. 2 is a bottom view of the removal tool of FIG. 1, with the divider plate removed to show the internal wires;

DETAILED DESCRIPTION OF THE PREFERRED EMBODIMENT

Figure 3:
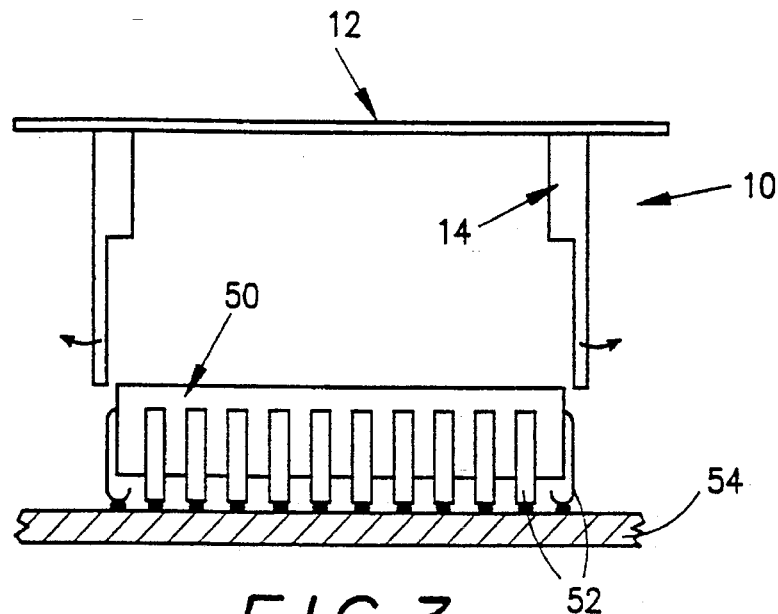
FIG. 3 is a schematic view of the removal tool according to the present invention, positioned above a surface mount device to be removed.

The removal tool 10 according to the present invention, as shown in FIGS. 1 and 2, includes a flexible carrier plate 12, legs 14 extending from the flexible carrier plate and a holding assembly 15 for holding the carrier plate. Also shown in FIG. 1 is a surface mount component 50 having a plurality of J-shaped leads 52 which are each electrically connected to a circuit board 54 by beads of solder 56. The removal tool 10 of the present invention can accommodate surface mount devices 50 of varying sizes due to the flexibility of the carrier plate 12 which allows the legs 14 to move apart to accommodate a particular component 50. In use, the removal tool 10 is positioned on the component 50 with inside surfaces of the legs 14 engaging the outer surfaces of the leads 52. The legs 14 are then heated to melt the solder 56, whereupon the component 50 is removed from the circuit board 54 by the removal tool without damaging the circuit board.

Each of the legs 14 of the removal tool 10 is configured with an upper portion which is connected to the carrier plate 12 by connecting members such as screws 16. It should be recognized that the legs may be connected to the carrier plate by any type of known connecting method. Alternatively, the legs and the carrier plate may be formed as a single member. The legs 14 are connected to the carrier plate 12 at a distance from the edge of the carrier plate, thereby providing a shoulder 66 of the carrier plate which extends beyond the legs. Each of the legs 14 also has two upper and lower grooves 18,19 which extend along the length of the internal surfaces of the legs. Each of the upper grooves 18 is provided with a ceramic tubular insert 62, while the lower grooves 19 accommodate a divider plate 60. The legs 14 are also preferably provided with a projection 21 of a copper material which provides a horizontal welding surface for ease of assembly.

A step 20 between the upper and lower portions of each of the legs 14 allows the lower portions of the legs to be thinner than the upper portions and creates a low mass leg design which allows rapid heat transfer through the legs. Opposing internal surfaces of the legs 14 are spaced according to the dimensions of the particular component 50 to be removed. The spacing S between the opposing legs 14 is preferably slightly smaller than the corresponding spacing S' of the minimum sized part. Therefore, the legs will contact all of the J-shaped leads 52 on components 50 having varying dimensions which are within the tolerance allowance.

Figure 4:
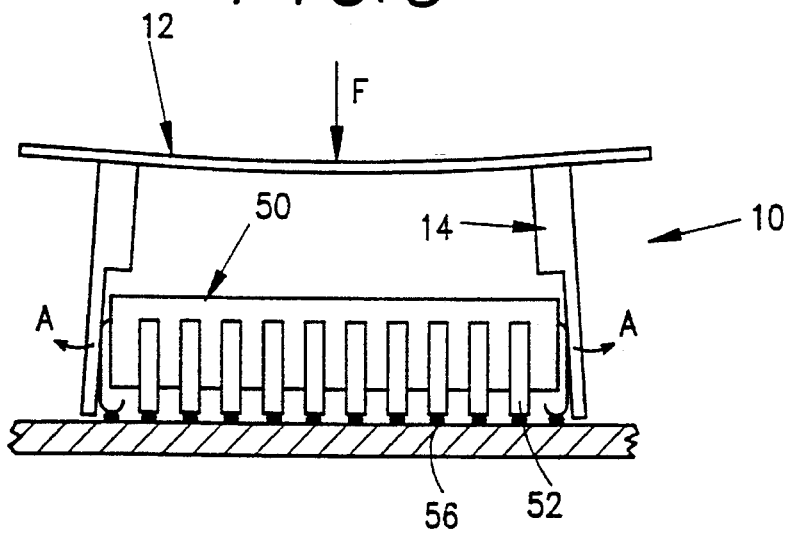
FIG. 4 is a schematic view of the removal tool according to the present invention, engaging a surface mount device.

As shown most clearly in FIG. 4, when the removal device 10 is lowered onto a component 50 having dimensions which are greater than the spacing between the legs 14, the leads 52 apply oppositely directed forces to the legs 14, and the legs are allowed to move apart under the influence of those forces by the flexing of the carrier plate 12. The legs 14 provide automatic spring tension or grip on the component leads which provides physical contact with each of the leads and also allows the component to be lifted from the circuit board.

The legs 14 are preferably formed of a material which is a good conductor of heat such as a copper alloy. Other suitable materials include brass, pure copper or other copper alloys such as leaded copper or tellurium copper.

The heating of the legs 14 is provided by electric resistance heating in a set of four heating wires 22 which pass through the tubular inserts 62 in the legs 14. The electric current is carried from the holding assembly 15 to the heating wires by the delivery wire 30 and the first and second heating wire connectors 26,28. The heating wires 22 heat the tubular inserts 62 which in turn heat the legs 14. The tubular inserts 62 are preferably ceramic, however, other insulators which are good conductors of heat may also be used.

The holding assembly 15 includes a pin connector 32 for connecting the removal tool to a source of electric current in a specifically designed handle (not shown). The pin connector 32 has an internal bore through which the delivery wire 30 extends. The delivery wire 30 is soldered at the end 34 of the pin connector 32 and provides a first electrical contact for electrical connection with the handle.

A carrier member 36 is attached to the pin connector 32 by an insulating collet 38. The insulating collet is preferable a high temperature insulator such as glass epoxy. The carrier member 36 provides a second electrical contact for a second electrical connection with the handle. The carrier member 36 is provided with an annular projection at a lower portion thereof and a carrier insulator 40 is mounted on the projection.

A carrier plate supporting tube 42 is mounted surrounding the carrier insulator 40. The flexible carrier plate 12 has a central circular hole configured to receive the supporting tube 42, so that, the flexible carrier plate abuts a flange 44 at the end of the tube. The carrier plate supporting tube 40 is preferably constructed of a thin sheet of stainless steel which results in a cool gripping area on the holding assembly 15 so that the holding assembly can be easily removed from the handle.

Also mounted on the carrier member 36 is a smaller conductor tube 46, made of a conducting material which connects the carrier member 36 to the second heating wire connector 28 completing the electrical circuit. The second heating wire connector 28 is preferably welded to the exterior surface of the conductor tube 46. The conductor tube 46 is provided with a ceramic insert tube 48 which isolates the delivery wire 30 from the conductor tube 46 and the second heating wire connector 28.

The heating and delivery wires are connected to heat the legs 14 as shown most clearly in FIG. 2 which shows a bottom view of the removal tool with the divider plate 60 removed. The delivery wire 30 extends from the solder connection 34 at the end of the pin connector 32, through bores in the pin connector, the carrier member 36 and the conductor tube 46. The delivery wire 30 bends at an angle of approximately ninety degrees (90°) at the exit of the conductor tube 46 to a contact position where it is mounted on the horizontal projection 21 on one of the legs 14 in electrical contact with a first heating wire connector 26.

The delivery wire 30 is preferably copper wire, however, other materials which are good conductors may also be used. The four heating wires 22 pass through the ceramic tubular inserts 62 in each of the four legs 14 and extend at either end of the tubular inserts. The heating wires 22 are each provided with a straight end 23 and a curved or bent end 24. The straight end 22 of one heating wire is positioned to contact the curved end 24 of the neighboring heating wire in a movable connection which accommodates relative motion of neighboring legs 14.

The first heating wire connector 26 is mounted preferably by welding at one end on the projection 21 on one of the legs 14 in electrical contact with the delivery wire 30. This connection is preferably made by welding, however, other known connecting methods may also be used. The other end of the first heating connector wire 26 provides a flexible connection with a straight end 23 of one of the heating wires 22. The second heating wire connector 28 is connected at one end to the conductor tube 46 and provides a movable connection at the other end with a curved end 24 of one of the heating wires 22. The heating wires 22 and the first and second heating wire connectors 26,28 are preferably made of stainless steel.

Electric current is supplied to the heating wires 22 from a specially designed handle unit which engages the upper end of the holding assembly 15. Three electrical contacts are provided between the holding assembly 15 and the handle. The first two electrical contacts are provided by the pin connector 32 and the carrier member 36, and the third contact provides a ground for the holding assembly.

The electrical connection between the first heating wire connector 26 which is preferably stainless steel and the delivery wire 30 which is preferably copper provides a thermocouple point 64 due to the different materials of the connected wires. This thermocouple 64 is used as a temperature sensor to provide temperature feedback to an external temperature controlling circuit. The external temperature controlling circuit is preferably a circuit which is known to those in the art which measures a voltage created by the thermocouple in response to the temperature and turns the electrical current supplied to the heating wires on and off depending on the sensed temperature. The location of the thermocouple 64 at a position close to the working surface of the heated legs 14 allows rapid and accurate temperature control of the tool.

The divider plate 60 is loosely mounted in the lower grooves 19 provided in the upper portion of the legs 14 for the purpose of hiding the wires and preventing foreign matter from entering the interior of the tool. The divider plate 60 is preferably formed of a somewhat flexible material such as stainless steel. The grooves 62 are of a sufficient depth that the divider plate 60 is maintained in the grooves in a floating position even when the legs 14 are spread apart by contact with a component 50.

Although the present invention has been particularly designed for the removal of surface mount devices having J-shape leads because of their high dimensional tolerances, it should be understood that the present invention can be used for the removal of many different types of electrical components. The removal tool of the present invention is preferably made available in a variety of sizes for removing electrical components of different sizes and types. However, all of the different size removal devices preferably will fit in the same handle unit.

Figure 5:
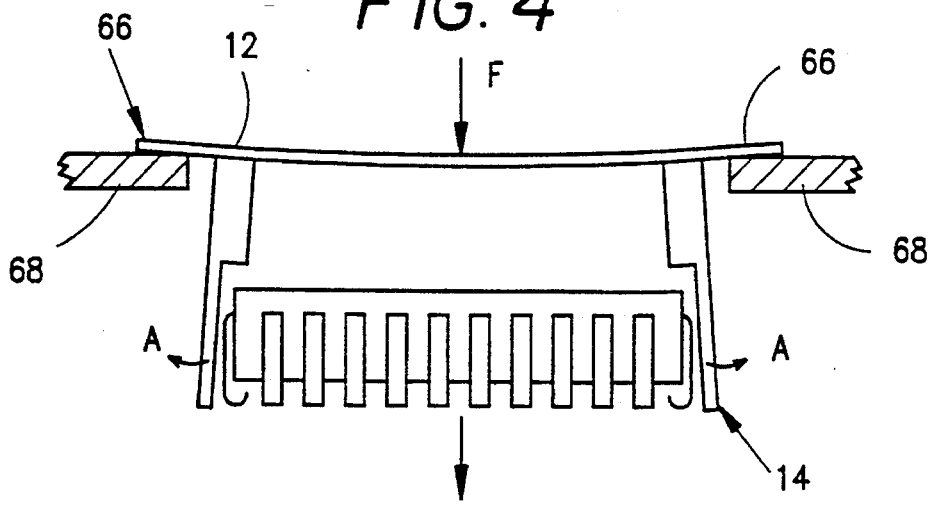
FIG. 5 is a schematic view of the removal tool according to the present invention, releasing a surface mount device which has been removed.

The operation of the surface mount device removal tool 10 of the present invention is shown in FIGS. 3–5. In particular FIG. 3 shows a schematic side view of the removal tool positioned above an electrical component 50 which is to be removed from a circuit board 54. As shown in FIG. 3, the distance S between the legs 14 is slightly smaller than the distance S' between the external surfaces of the J-shaped leads 52 on opposite sides of the device.

FIG. 4 shows a schematic view of the removal tool 10 positioned for removal of a component 50. As shown in FIG. 4, the plate 12 has flexed and legs 14 have been spread apart in the direction of arrows A, by contact with the component 50, and the legs are in contact with all of the J-shaped leads 52 regardless of the size of the component 50. Once the removal tool 10 is placed on the component 50 by the exertion of a downward force F, as shown in FIG. 4, the heated legs 14 melt the beads of solder 56 on each of the leads 52. When all of the solder connections 56 have been melted, the component 50 is lifted from the circuit board 54 while the legs 14 of the removal device grip the component leads 52.

The removal device according to the present invention with the flexible carrier plate 12 and movable legs 14 prevents removal of the component 50 before all of the solder connections are melted because if all of the solder is not melted the component will slip out of the grip of the legs when the tool 10 is raised. This prevents damage to the circuit board 54 caused when components are removed prior to all of the solder being melted.

FIG. 5 is a schematic view of the release of a removed component 50 from the removal tool 10. As shown in FIG. 5, a support surface 68 is provided which is used in conjunction with the removal tool 10 to release the component from the grasp of the legs 14. The support surface 68 is configured to mate with the shoulders 66 of the carrier plate so that when shoulders 66 of the removal device are placed on the support surface 68, the user may release the component 50 by pressing down on the handle of the removal device, with a force F, causing the carrier plate 12 to flex and the legs 14 to move apart in the direction of arrows A. In this way the component 50 can be desoldered, removed and released from the removal tool 10 all with one hand.

The support surface 68 may be provided in any convenient manner, for example, the support surface may be mounted on the top of a receptacle so that the removed components 50 may be deposited in the receptacle.

While the invention has been described in detail with reference to specific embodiments thereof, it will be apparent to one skilled in the art that various changes and modification can be made, and equivalents employed, without departing from the spirit and scope of the invention.

What is claimed is:

1. A desoldering tool for desoldering and removing an electrical component having leads on at least two sides, comprising:

a flexible carrier plate;

a plurality of heatable legs attached to said flexible carrier plate, said plurality of legs configured to contact the leads on said electrical component; and said flexible carrier plate being sufficiently flexible so that a force on the legs causes flexing of the carrier plate which allows the plurality of legs to deflect to accommodate electrical components of varying sizes.

2. The desoldering tool according to claim 1, wherein said plurality of heatable legs are attached to said carrier plate at a position away from the edges of the carrier plate, and said edges of said carrier plate provide shoulders adapted to be engaged by a support surface for removal of said electrical component from said plurality of legs.

3. The desoldering tool according to claim 1, wherein said plurality of heatable legs are substantially rigid.

4. The desoldering tool according to claim 1, further comprising four heatable legs.

5. The desoldering tool according to claim 1, wherein said plurality of heated legs provide a spring tension grip on the leads of the electrical component sufficient to remove the component from a circuit board when all solder connections are melted and insufficient to remove the component from the circuit board when less than all the solder connections are melted.

6. The desoldering tool according to claim 1, wherein a flexibility of the carrier plate is greater than a flexibility of the legs.

7. The desoldering tool according to claim 1, further comprising electrical resistance heating elements for heating said plurality of legs.

8. The desoldering tool according to claim 7, further comprising a temperature sensor connected to one of said plurality of legs.

9. The desoldering tool according to claim 8, wherein said temperature sensor is a thermocouple.

10. The desoldering tool according to claim 8, further comprising a temperature controlling circuit for turning said electrical resistance heating elements on and off in response to information provided by said temperature sensor.

11. A desoldering tool for desoldering and removing an electrical component having leads on at least two sides from a base, comprising:

a holding assembly;

a flexible carrier plate attached to said holding assembly;

a plurality of legs attached to said flexible carrier plate, said plurality of legs configured to contact the leads on said electrical component;

at least one heating element for heating said plurality of legs; and said flexible carrier plate being sufficiently flexible so that a force on the legs causes flexing of the carrier plate which allows the plurality of legs to deflect outward to accommodate electrical components of varying sizes.

12. The desoldering tool according to claim 11, wherein a flexibility of the carrier plate is greater than a flexibility of the legs.

13. The desoldering tool according to claim 11, wherein said plurality of legs are attached to said carrier plate at a position away from the edges of the carrier plate, and said edges of said carrier plate provide shoulders adapted to be engaged for removal of said electrical component from said plurality of legs.

14. The desoldering tool according to claim 11, wherein said holding assembly comprises a first electrical connector for connecting a source of electric current to said at least one heating element and a second electrical connector separated from said first electrical connector by an insulator.

15. The desoldering tool according to claim 14, wherein said holding assembly is adapted to engage a handle assembly and said first and second electrical connectors are adapted to engage electrical connectors provided in said handle assembly.

16. The desoldering tool according to claim 11, wherein a heating element is provided in each of said plurality of legs and the heating elements are connected to the heating elements in neighboring legs by movable electrical connections.

17. The desoldering tool according to claim 16, wherein the heating elements are connected to a source of electric current by a movable connection.

18. The desoldering tool according to claim 11, further comprising a temperature sensor connected to one of said plurality of legs.

19. The desoldering tool according to claim 18, wherein said temperature sensor is a thermocouple.

20. The desoldering tool according to claim 18, further comprising a temperature controlling circuit for turning said heating element on and off in response to information provided by said temperature sensor.

21. A method of desoldering and removing an electrical component having leads on at least two sides from a circuit board, comprising:

providing a removal tool including a flexible carrier plate having shoulders on external edges thereof and a plurality of legs attached to said flexible carrier plate;

positioning said legs in contact with the leads on said electrical component;

heating said legs to melt solder which connects the leads to the circuit board;

removing said electrical component from said circuit board with said removal tool; and releasing said electrical component from said removal tool by applying a force to said shoulders to flex said carrier plate and cause the plurality of legs away from one another.

* * * * *